United States Patent
Griffith et al.

(10) Patent No.: US 7,898,333 B2
(45) Date of Patent: Mar. 1, 2011

(54) OPERATIONAL AMPLIFIER

(75) Inventors: Zachary M. Griffith, Thousand Oaks, CA (US); Miguel E. Urteaga, Moorpark, CA (US); Mark J. W. Rodwell, Santa Barbara, CA (US)

(73) Assignees: Teledyne Scientific & Imaging, LLC, Thousand Oaks, CA (US); The Regents of the University of California, Oakland, CA (US)

( * ) Notice: Subject to any disclaimer, the term of this patent is extended or adjusted under 35 U.S.C. 154(b) by 198 days.

(21) Appl. No.: 12/247,974

(22) Filed: Oct. 8, 2008

(65) Prior Publication Data
US 2009/0289714 A1 Nov. 26, 2009

Related U.S. Application Data

(60) Provisional application No. 61/055,916, filed on May 23, 2008.

(51) Int. Cl.
*H03F 3/45* (2006.01)

(52) U.S. Cl. .................. 330/260; 330/306; 330/310

(58) Field of Classification Search ............... 330/260, 330/306, 310
See application file for complete search history.

(56) References Cited

U.S. PATENT DOCUMENTS

| | | | |
|---|---|---|---|
| 5,886,581 A * | 3/1999 | Hugel et al. | 330/308 |
| 6,552,605 B1 * | 4/2003 | Yoon | 330/9 |
| 6,816,009 B2 * | 11/2004 | Hughes et al. | 330/85 |
| 6,834,165 B2 * | 12/2004 | Feng | 398/202 |
| 6,873,703 B1 * | 3/2005 | Enriquez | 379/399.01 |
| 7,075,364 B2 * | 7/2006 | Gudem et al. | 327/552 |

* cited by examiner

*Primary Examiner*—Patricia Nguyen
(74) *Attorney, Agent, or Firm*—Snell & Wilmer L.L.P.

(57) ABSTRACT

The present invention relates generally to an operational amplifier. In one embodiment, the present invention is an operational amplifier including a transimpedance input stage, the transimpedance input stage including a first stage connected to a first resistor and a second resistor, and an output stage connected to the transimpedance input stage.

36 Claims, 12 Drawing Sheets

OPERATIONAL AMPLIFIER

CROSS-REFERENCE TO RELATED APPLICATIONS

The present application for patent claims priority from and the benefit of provisional application Ser. No. 61/055,916 entitled "TRANSIMPEDANCE-STAGE INPUT, AND SHORT-PATH FEEDBACK DESIGN AND LAYOUT TECHNIQUES OF STABLE MM-WAVE OPERATIONAL AMPLIFIERS FOR STRONG INTERMODULATION DISTORTION SUPPRESSION," filed on May 23, 2008, which is expressly incorporated herein by reference.

STATEMENT REGARDING GOVERNMENT RIGHTS

This invention was made with Government support under Contract No. N66001-06-C-2005 awarded by the Defense Advanced Research Projects Agency ("DARPA") on behalf of the Navy Space & Naval Warfare Systems Command ("SPAWAR"). The Government has certain rights in this invention.

BACKGROUND

1. Field

The present invention relates generally to an operational amplifier and more particularly to an operational amplifier including a transimpedance input stage.

2. Description of Related Art

Conventional operational amplifiers ("op-amps") are often hampered by low gains when high gains are required or instability at high gains at high frequencies. Furthermore, construction of conventional op-amps may also require complementary technology for implementation which can limit the material used for the fabrication of op-amps.

Thus, there is a need for an op-amp that can function stably with higher gains at high frequencies and which can operate without complementary technology.

SUMMARY

In one embodiment, the present invention is an operational amplifier including a transimpedance input stage, the transimpedance input stage including a first stage connected to a first resistor and a second resistor, and an output stage connected to the transimpedance input stage.

In another embodiment, the present invention is an operational amplifier including a first stage, an input source connected to the first stage, an output stage connected to the first stage, and a low-pass filter connected between the first stage and the input source.

In yet another embodiment, the present invention is a method for forming an operational amplifier including the steps of placing biasing components in a periphery position, and placing active components in a central position relative to the biasing components, thereby reducing a length of the feedback loop.

BRIEF DESCRIPTION OF THE DRAWINGS

Other systems, methods, features and advantages of the present invention will be or will become apparent to one with skill in the art upon examination of the following figures and detailed description. It is intended that all such additional systems, methods, features and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Figure 1:
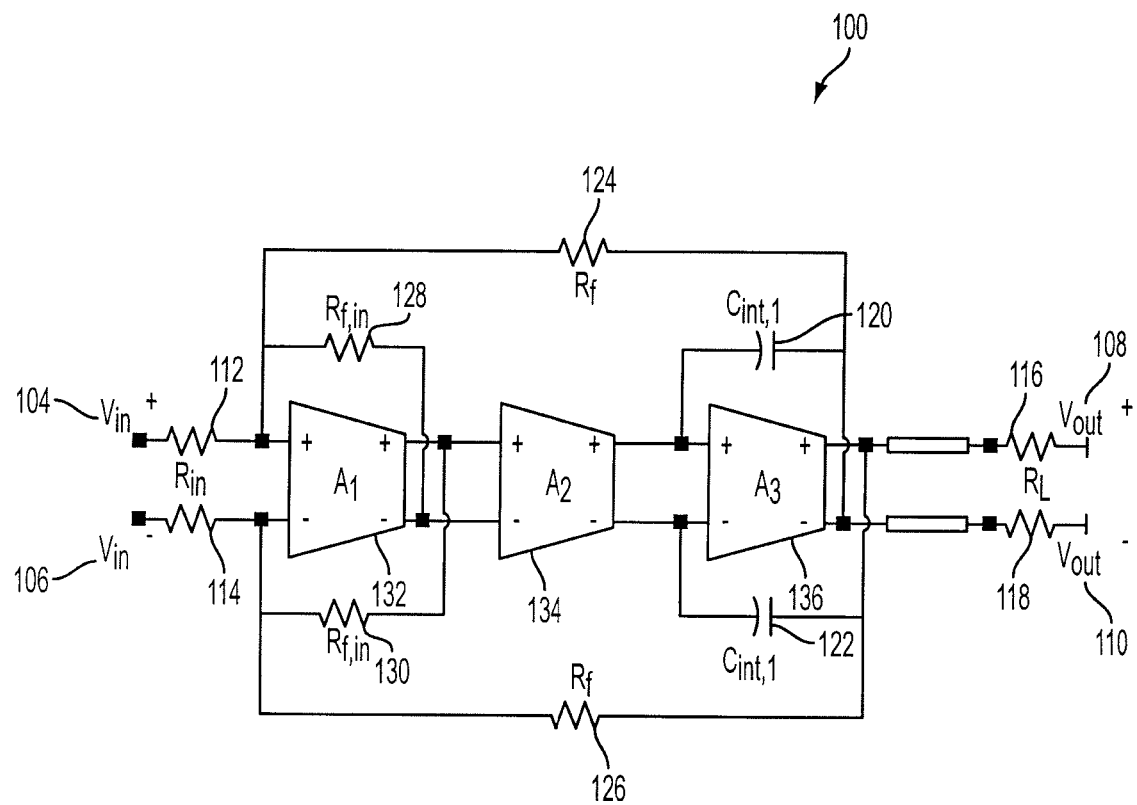
FIG. 1 is a schematic diagram of an operational amplifier.

FIG. 1 is a schematic diagram of an operational amplifier ("op-amp"). Op-amp 100 includes a transimpedance input stage. As seen in FIG. 1, op-amp 100 also includes voltage inputs 112 and 114, voltage outputs 108 and 110, stages 132, 134, and 136, resistors 112, 114, 128, 130, 124, and 126, and capacitors 120 and 122. Although stages 132, 134, and 136 are differential gain elements, one or more of the stages can be other types of gain elements such as a single ended gain element.

Voltage inputs 104 and 106 are connected to inputs of stage 132 while voltage outputs 116 and 118 along are connected to outputs of stage 136. Likewise, resistors 112 and 114 are input resistors and are connected to the inputs of stage 132 while resistors 116 and 118 are load or output resistors and are connected to the outputs of stage 136. Resistors 124 and 126 are feedback resistors which are connected to the inputs of stage 132 and the outputs of stage 136.

Figure 2:
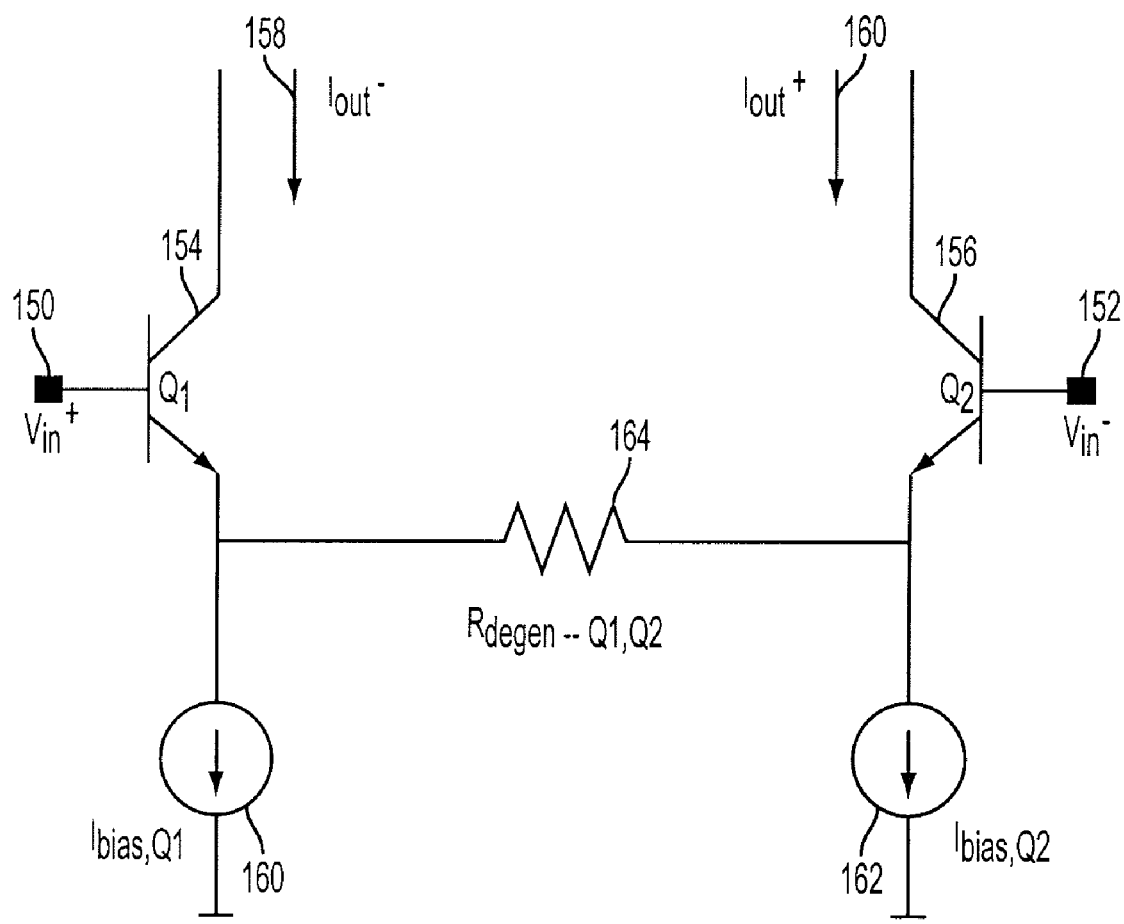
FIG. 2 is a schematic diagram of a simple differential pair with NPN HBT implementation.

Stage 132 is connected to stage 134 and stage 134 is also connected to stage 136. Stage 136 can be an output stage while stage 132 can be an input stage. Stage 132 and stage 134 can each be a simple differential pair such as the simple differential pair depicted in FIG. 2. The simple differential pair can include NPN heterojunction bipolar transistors ("HBT") 154 and 156, current sources 160 and 162, and resistor 164. Current sources 160 and 162 can be bias current sources and voltage inputs 150 and 152 can be applied at the bases of NPN HBTs 154 and 156. Furthermore, currents 158 and 160 flow into the collectors of NPN HBTs 154 and 156. Resistor 164 can be a degenerative resistor. However, the differential pair is not limited to just using NPN HBTs and can utilize, for example, other types of HBTs, bi-polar junction transistors ("BJT"), field-effect transistors ("FETs"), transistors, and/or metal-oxide-semiconductor ("CMOS") in conjunction with or instead of NPN HBTs.

Figure 3:
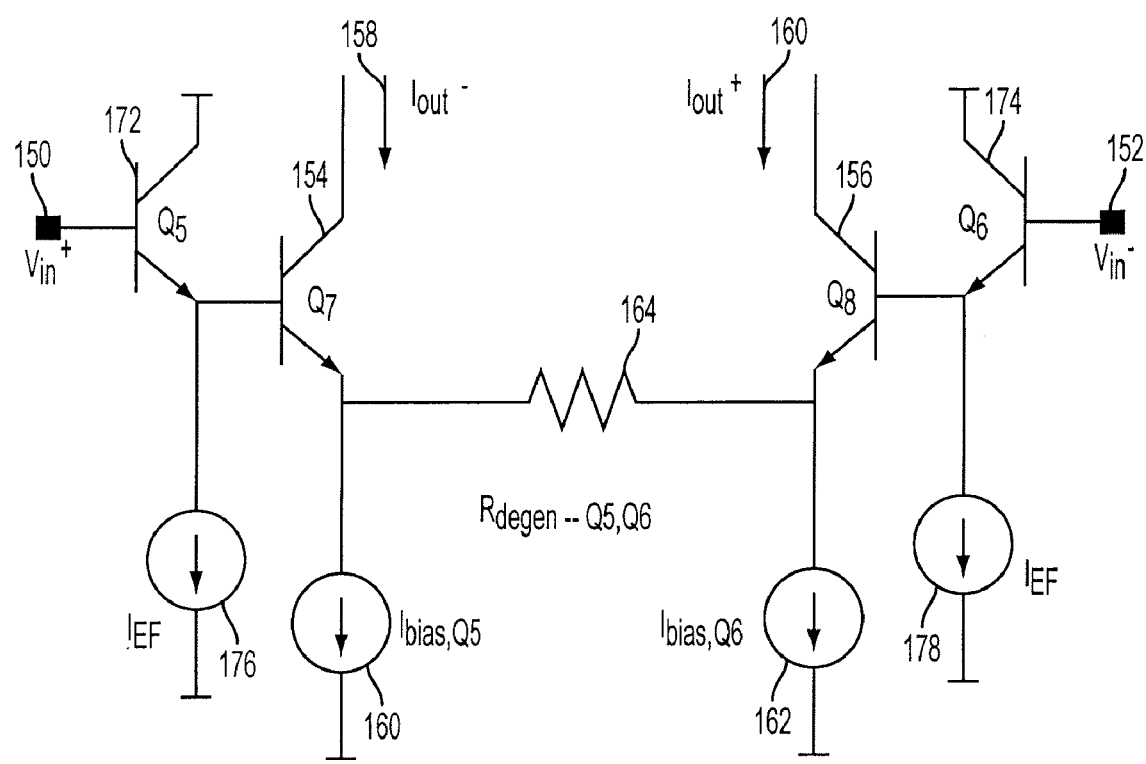
FIG. 3 is a schematic diagram of a Darlington differential pair with NPN HBT implementation.

Output stage 136 can be a Darlington differential pair such as the Darlington differential pair depicted in FIG. 3. The Darlington differential pair in FIG. 3 includes NPN HBT 172 and 174 in addition to NPN HBT 154 and 156. The Darlington differential pair also includes current sources 176 and 178 in addition to current sources 160 and 162. In FIG. 3, voltage inputs 150 and 152 are applied to the bases of NPN HBT 172 and 174. The emitters of NPN HBT 172 and 174 are connected to current sources 176 and 178 and also the bases of NPN HBT 154 and 156. Likewise, the Darlington differential pair is not limited to just using NPN HBTs and can utilize, for example, other types of HBTs, BJTs, FETs, transistors, and/or CMOS in conjunction with or instead of NPN HBTs.

In FIG. 1, capacitors 120 and 122 are integrative capacitors which are connected to the inputs and outputs of stage 136. Integrative capacitor 120 is connected to a positive input of stage 136 and a negative output of stage 136 while integrative capacitor 122 is connected to a negative input of stage 136 and a positive output of stage 136.

Resistors 128 and 130 are connected to input resistors 112 and 114 and the outputs of stage 132. Notably, resistor 128 is connected to a positive input of stage 132 and a negative output of stage 132 while resistor 130 is connected to a negative input of stage 132 and a positive output of stage 132. As can be seen in FIG. 1, stage 132 and resistors 128 and 130 form a transimpedance input stage.

In operation, the transimpedance input stage can reduce a dependence of the feedback loop transmission from a volatility of the source and load impedances, permitting stable op-amp operation in a more arbitrary impedance environment across its loop bandwidth. That is, the use of the transimpedance input stage allows op-amp 100 to operate stably over a broader range of input source and output load impedance. This can be advantageous when the characteristics of the input source and/or output load impedances are unknown. Input signals can operate across many octaves of operation such as in DC to mm-Wave frequencies. With unknown input signals, the real and reactive contributions associated with the source and/or the load in conventional op-amps can present unfavorable impedances to the conventional op-amp and cause the feedback loop transmission of the conventional op-amp to be volatile and vary considerably. This can cause op-amp instability as the operating frequency of the conventional op-amp approaches the conventional op-amp loop bandwidth.

However, op-amp 100 of the present invention, which can utilize the transimpedance stage, may better handle a broader range of frequency operation to its loop bandwidth and still operate stably as there is a reduced dependency of the feedback loop transmission from unfavorable input source and output load impedances. Thus, the unknown nature of the input and load can have a reduced effect on the feedback loop transmission and thus the volatility of the feedback loop transmission can be reduced.

Furthermore, the use of a transimpedance input stage can allow for the addition of an additional gain element to the op-amp, without modifying the dominant and secondary system poles. In conventional op-amp topologies, only two gain stages are employed so that pole-splitting through the use of a compensation capacitor can stabilize the amplifier. Conventional op-amps which add an additional gain stage to the input of the conventional op-amp without the use of resistors and/or the transimpedance stage would cause the output of the additional gain stage to be a high impedance node instead of a low impedance node. Having a high impedance node at the output of the first stage would introduce an additional system pole. This additional pole would contribute at higher frequencies signal phase delay such that at operating frequencies below the op-amp loop bandwidth, the feedback would become positive and the amplifier would become unstable. Advantageously, with the use of the transimpedance input stage in the present invention, an additional gain stage such as stage 132 can be employed by op-amp 100, since the output impedance of the additional gain stage is now low, instead of high, such that no additional system pole is observed, and the dominant and secondary system poles are unchanged. That is, the output of the additional gain stage can be a low impedance node instead of a high impedance node which can prevent an additional system pole from being observed and also the instability of op-amp 100.

In addition, because the present invention permits stable operation of op-amp 100 to higher values of loop bandwidth, the open-loop gain and gain bandwidth product can be increased through the use of this additional gain stage. By increasing the open-loop gain, the total loop transmission (ratio of open-loop gain to closed loop gain) can be increased without degradation in the stability phase margin at higher frequencies. For example, with the present invention, the loop bandwidth can be 30 GHz, 40 GHz, 50 GHz, or any other high bandwidth values. This can be particularly useful when the operational frequency is 2 GHz for example, where the loop transmission is large. Since loop transmission is equivalent to the loop bandwidth divided by the operational frequency, in such an embodiment, the loop transmission can be 15, 20, 25, or more depending on the loop bandwidth and the operational frequency. Thus, a higher loop transmission can be achieved with the present invention which can be useful across its frequency of operation, particularly at lower frequencies where strong feedback associated with the loop transmission can act to reduce and/or suppress distortion generated by the op-amp.

Figure 4:
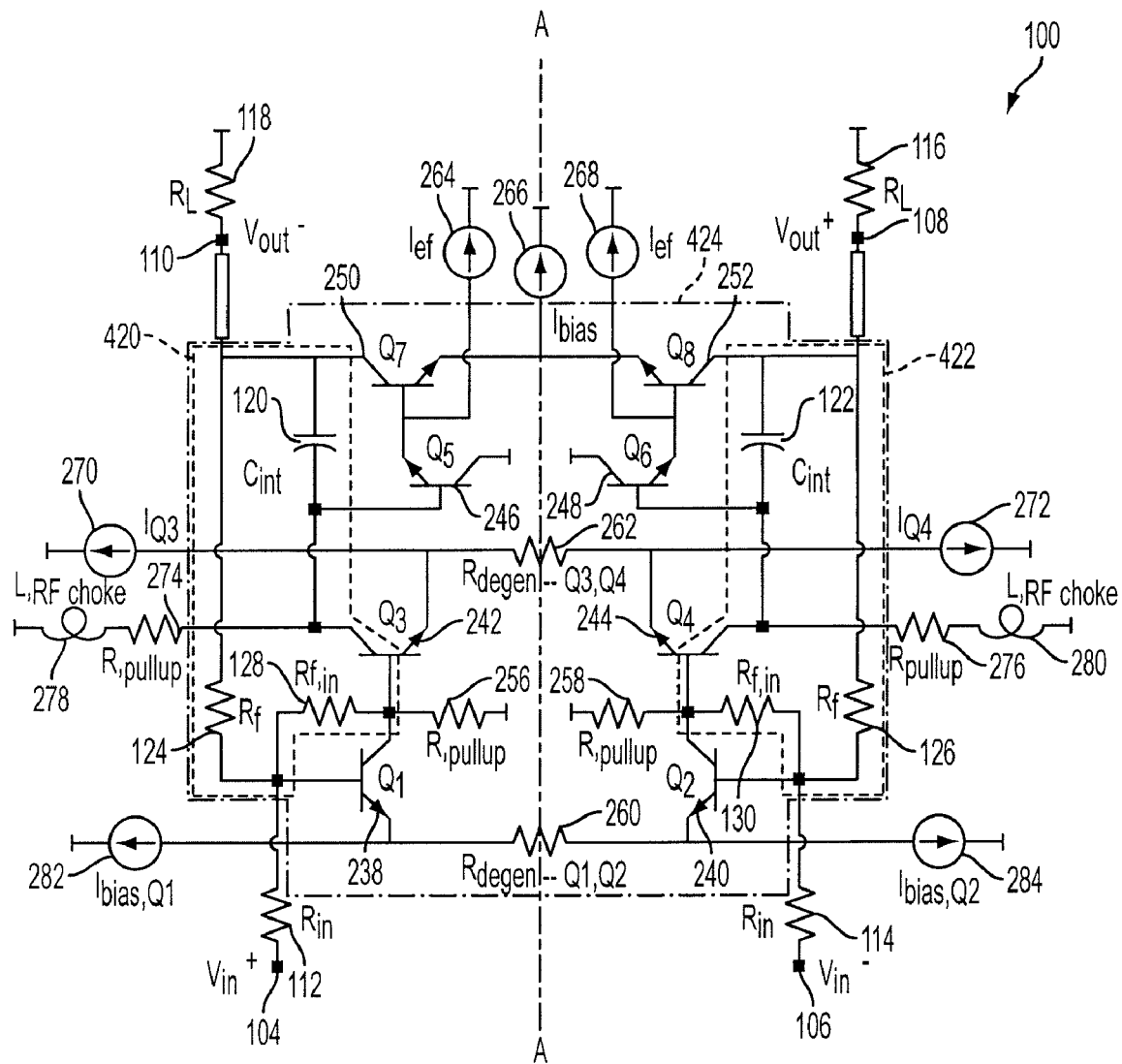
FIG. 4 is a detailed floorplan of an operational amplifier.

FIG. 4 is a detailed floorplan of the operational amplifier. As shown in FIG. 4, in addition to the components in FIG. 1, op-amp 100 now also includes resistors 256, 258, 274 and 276, and inductors 278 and 280. In FIG. 4, stage 132 includes NPN HBTs 238, 240, resistor 260, and current sources 282 and 284. Current sources 282 and 284 can be bias currents. Resistors 256 and 258 can be pull-up resistors. Stage 134 includes NPN HBTs 242 and 244, resistor 262, and current sources 270 and 272. Stages 132 and 134 are each a simple differential pair with split current biasing. Stage 136 includes NPN HBT 246, 248, 250, and 252, and current sources 264, 266, and 268. Current source 266 can be a bias current. Stage 136 is a Darlington differential pair with split current biasing. Resistors 274 and 276 and inductors 278 and 280 form resistor-inductor loadings which connect stages 134 and 136.

Although HBTs are used, it is contemplated that other types of HBTs, BJTs, FETs, transistors, and/or CMOS can also be used instead of or in conjunction with the HBTs. Furthermore, although current sources are used, current sources 264, 268, 270, 272, 282, and 284 can be replaced with resistors or a transistor current source.

As seen in FIG. 4, the floorplan of op-amp 100 is folded and symmetrical as op-amp 100 is symmetrical about axis A-A. The symmetrical and folded design can aid in reducing a size of op-amp 100. In one embodiment, smaller components of op-amp 100 and/or the feedback loop components are located in a central position and larger components and non-feedback loop components are located in a periphery position relative to the smaller components and/or the feedback loop components in order to reduce a length of feedback loops 420 and 422. It is contemplated that generally active components for gain elements can be smaller than biasing components and/or local stage loading components and as such active components for gain elements can generally be located in a central position and biasing components and/or local stage loading components can generally be located in a periphery position.

In FIG. 4, components within zone 424 are generally considered active components for gain elements and feedback loop components while components outside zone 424 are generally considered bias components and/or local stage loading components. In one embodiment, the biasing components include current sources or resistive pull-downs while local stage loading components include resistive, resistor-inductor series, and/or active-load devices not associated with the feedback loops. Although resistors 256 and 258 are shown within zone 424, it is contemplated that they can also be placed outside of zone 424.

Figure 5:
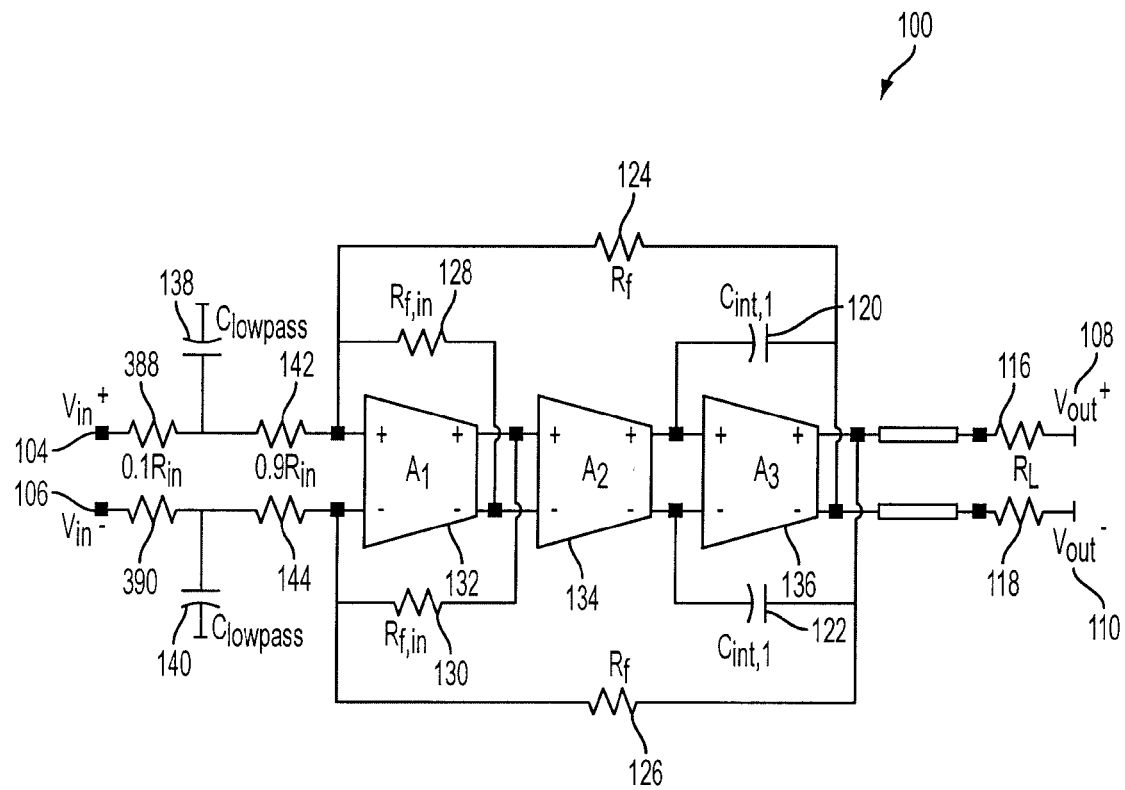
FIG. 5 is a schematic diagram of an alternate embodiment of an operational amplifier.

FIG. 5 is a schematic diagram of an alternate embodiment of an operational amplifier. As seen in FIG. 5, op-amp 100 utilizes a low-pass filter such as a resistor-capacitor-resistor low-pass filter. The low-pass filter in op-amp 100 can include capacitors 138 and 140 and resistors 388, 390, 142, and 144. Resistors 388 and 142 can have a total value equivalent to resistor 112 while resistors 390 and 144 can have a total value equivalent to resistor 114. In one embodiment, resistors 142 and 144 are nine times the value of resistors 388 and 390. However, any appropriate ratio and not just a nine to one ratio can be utilized.

It is contemplated that the use of a resistor-capacitor-resistor low-pass filter at the input of op-amp 100 can aid in stabilizing op-amp 100 where the feedback loop and hence the loop transmission is decoupled from the input source at higher frequencies. This may be particularly useful where op-amp 100 is used to provide very low distortion amplification at low GHz frequencies where having the highest loop-transmission is required. Through the use of the resistor-capacitor-resistor low-pass filter, stable op-amp 100 operation having low distortion can be achieved because while the op-amp loop-transmission and loop bandwidth are high, the op-amp operating bandwidth is truncated by the resistor-capacitor-resistor low-pass filter to below those frequencies that would otherwise excite unstable operation. Although FIG. 5 depicts op-amp 100 with a resistor-capacitor-resistor low-pass filter, it is contemplated that other types of low-pass filter may be used. Furthermore, although FIG. 5 depicts op-amp 100 with a transimpedance stage input, it is contemplated that the low-pass filter may be used with or without a transimpedance stage input.

Figure 6:
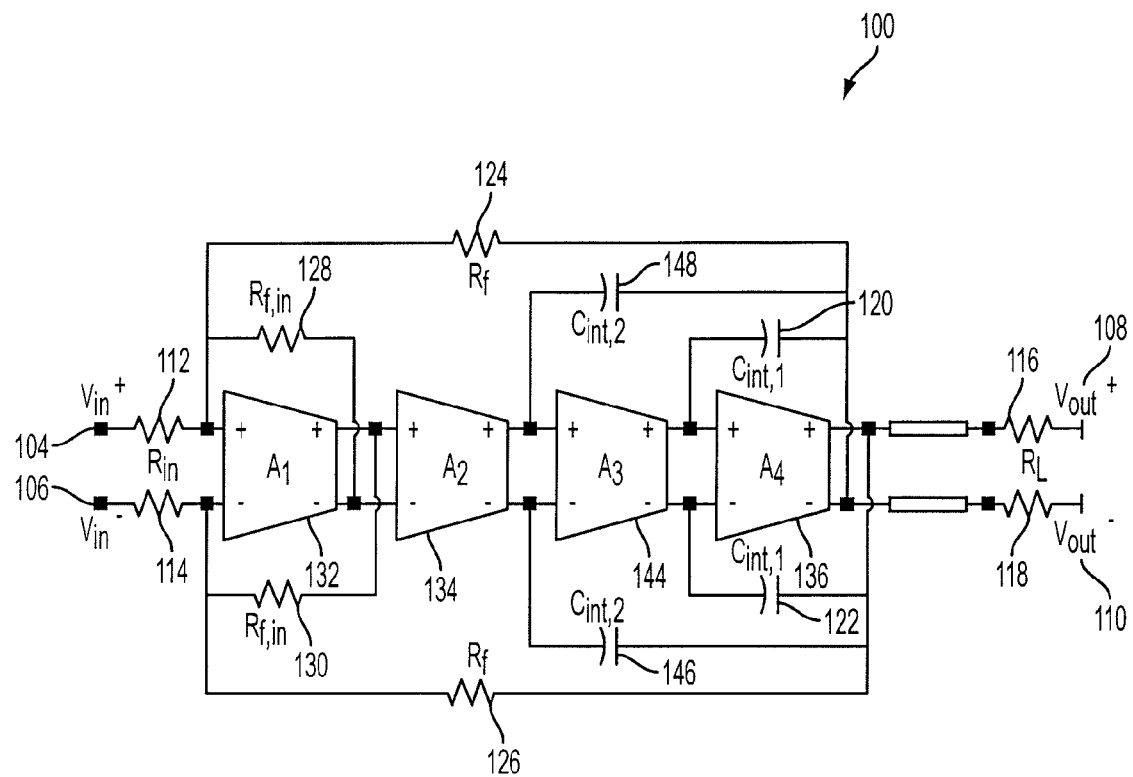
FIG. 6 is a schematic diagram of an alternate embodiment of an operational amplifier.
Figure 7:
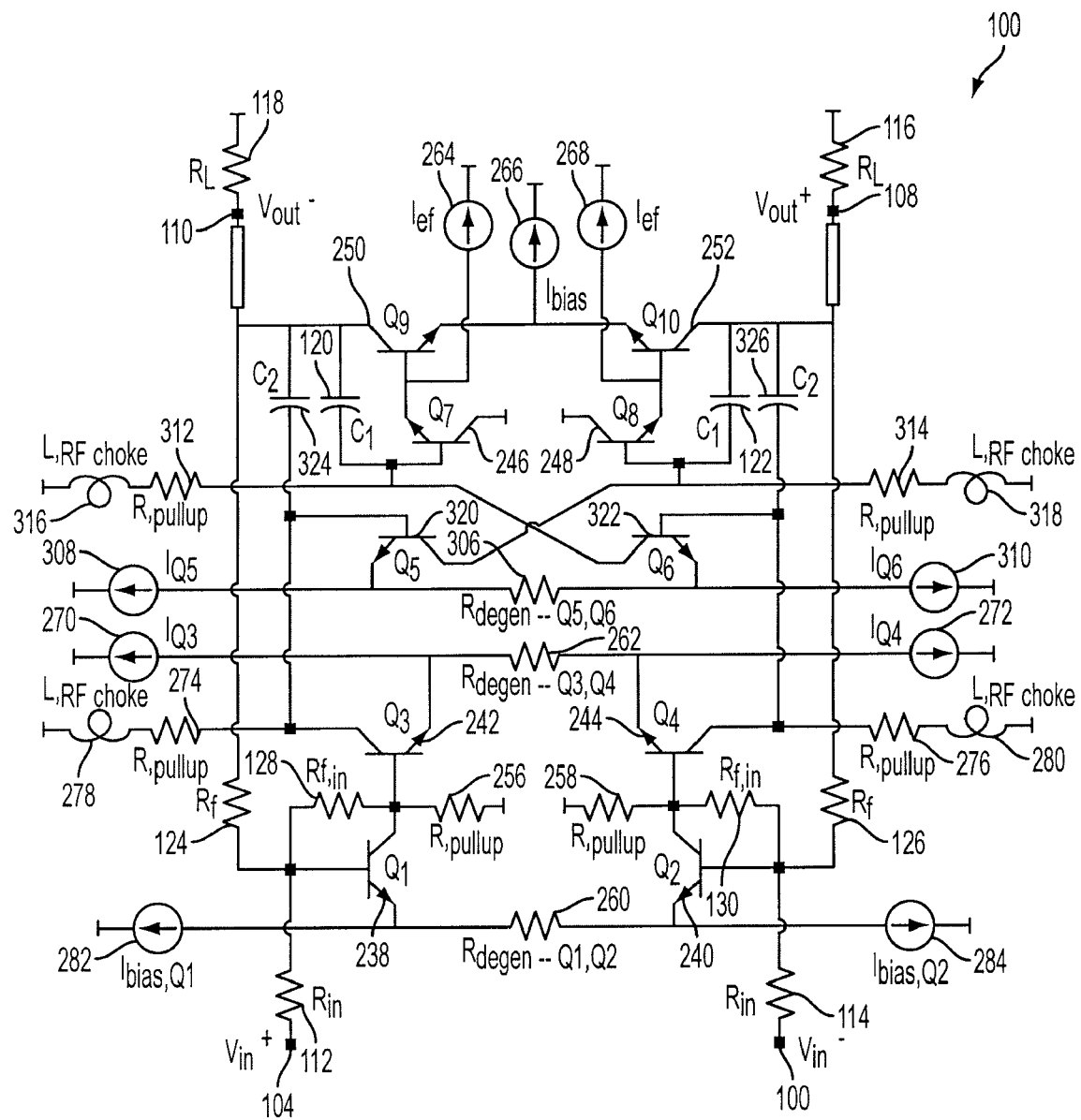
FIG. 7 is a detailed floorplan of an alternate embodiment of an operational amplifier.

FIG. 6 is a schematic diagram of an alternate embodiment of an operational amplifier. As seen in FIG. 6, op-amp 102 includes four stages instead of three stages. That is, op-amp 100 includes stages 130, 134, 136, and 144. Op-amp 100 also includes capacitors 144 and 148. In FIG. 7, outputs from stage 134 are connected to inputs of stage 144 and capacitors 144 and 148. The outputs of stage 144 are connected to stage 136 and capacitors 120 and 122. The outputs of stage 136 are connected to capacitors 120, 122, 146, 148, and resistors 116 and 118. Stages 132, 134, and 144 can be, for example, simple differential pairs while stage 136 can be a simple differential pair. The use of an additional stage can further increase the open-loop gain and subsequently increase the loop-transmission at lower frequencies where low distortion amplification may be desired.

FIG. 7 is a detailed floorplan of an alternate embodiment of an operational amplifier. As seen in FIG. 7, since op-amp 100 includes four stages, which is an even number, op-amp 100 includes a signal crossover between the output stage which is stage 136 and the stage immediately preceding the output stage which is stage 144. In FIG. 7, stage 132 includes NPN HBTs 238 and 240, resistor 260, and current sources 282 and 284. Stage 134 includes NPN HBTs 242 and 244, resistor 262, and current sources 270 and 272. Stage 144 includes NPN HBTs 320 and 322, resistor 306, and current sources 308 and 310. Stage 136 includes NPN HBTs 246, 248, 250, and 252, and current sources 264, 266, and 268. With a four stage op-amp such as that depicted in FIG. 7, the signal crossover occurs between the stage immediately preceding the output stage and the output stage such as stage 144 and stage 136. That is, the collector of NPN HBT 320 is now connected to the base of NPN HBT 248 instead of the base of NPN HBT 246 while the collector of NPN HBT 322 is now connected to the base of NPN HBT 246 instead of the base of NPN HBT 248. The use of the signal crossover ensures that the feedback is negative for the compensated stages and the overall feedback network. This in turn ensures stable operation of the operational amplifier since positive feedback would render it unstable.

Figure 8:
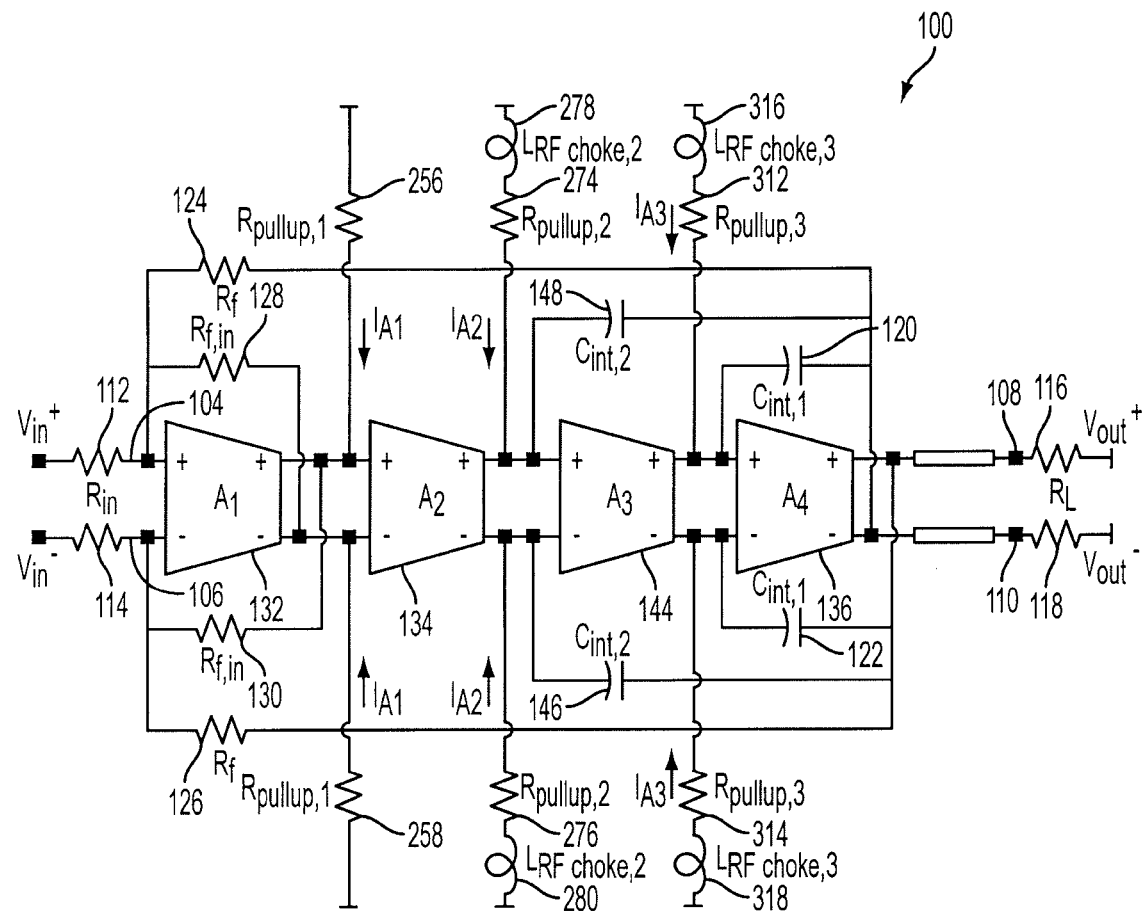
FIG. 8 is a schematic diagram of the alternate embodiment of the operational amplifier depicted in FIG. 7.

FIG. 8 is a schematic diagram of the alternate embodiment of the operational amplifier depicted in FIG. 7. As seen in FIG. 7 and FIG. 8, through the use of the transimpedance stage for stability and/or the use of the compact folded floor plan, biasing can be accomplished with resistors such as resistor 256 or resistor-inductor series such as resistor 274 and inductor 278. With biasing through only resistors and/or resistor-inductor series, the present invention can be formed with single type devices where no complementary devices are available and/or needed. In addition, the op-amps depicted in FIG. 1 and FIG. 4 can also be formed with single type devices where no complementary devices are available, even when an amount of resistors and resistor inductor series biasing is varied.

Figure 9:
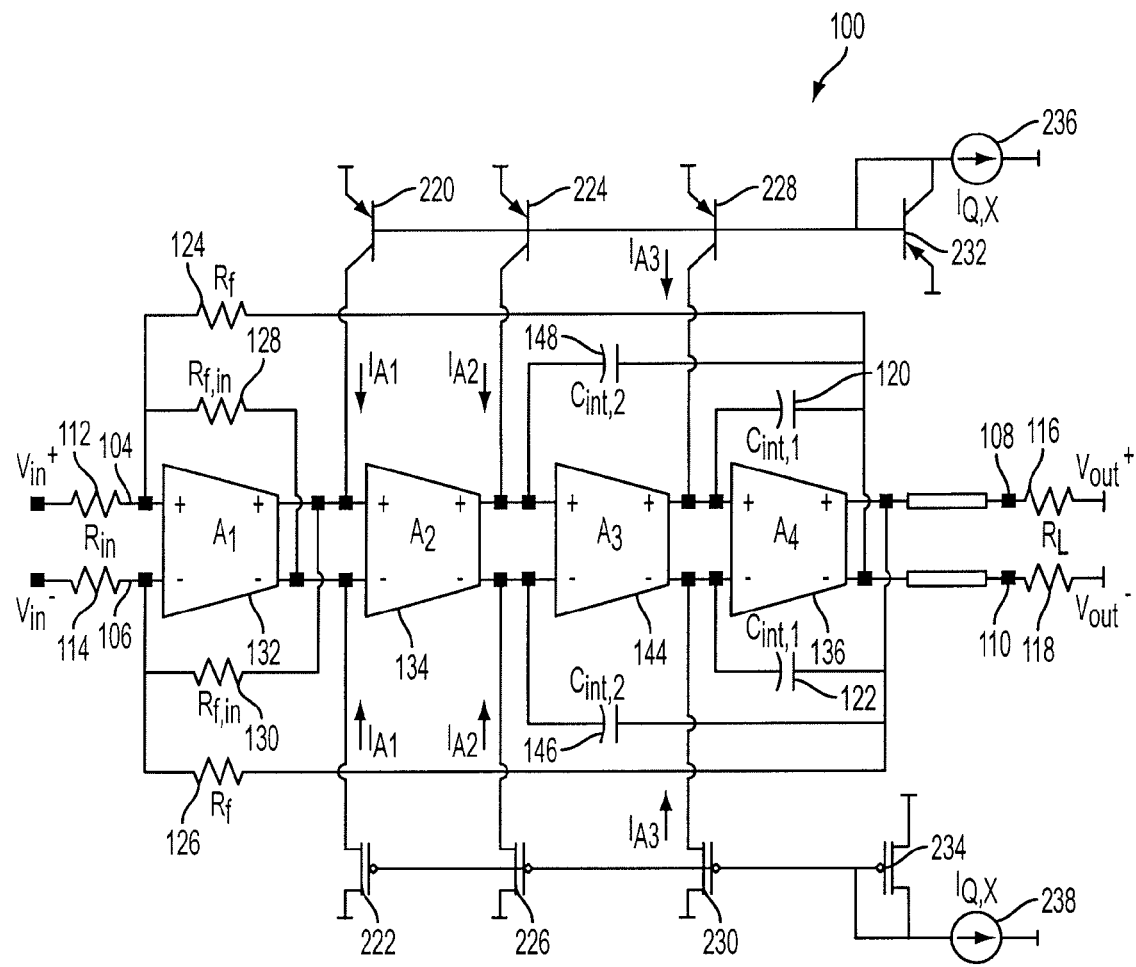
FIG. 9 is a schematic diagram of an alternate embodiment of an operational amplifier.

FIG. 9 is a schematic diagram of an alternate embodiment of an operational amplifier. In addition to the components depicted in FIG. 7, op-amp 100 in FIG. 9 includes PNP HBT 220, 224, 228, 232, P-type CMOS 222, 226, 230, 234, and current sources 236 and 238 which can be used for active loading. A collector of PNP HBT 220 is connected to a positive output of stage 132, a positive input of stage 134, and resistor 130 while a base of PNP HBT 220 is connected to a base of PNP HBT 224. A drain of P-type CMOS 222 is connected to a negative output of stage 132, a negative input of stage 134, and resistor 128 while a gate of P-type CMOS 222 is connected to a gate of P-type CMOS 226.

A collector of PNP HBT 224 is connected to a positive output of stage 134, and a positive input of stage 144, while a base of PNP HBT 224 is connected to a base of PNP HBT 228. A drain of P-type CMOS 226 is connected to a negative output of stage 134, and a negative input of stage 144, while a gate of P-type CMOS 226 is connected to a gate of P-type CMOS 230.

A collector of PNP HBT 228 is connected to a positive output of stage 144, a positive input of stage 136, and capacitor 120, while a base of PNP HBT 228 is connected to a base and a collector of PNP HBT 232 and current source 236. A drain of P-type CMOS 230 is connected to a negative output of stage 144, a negative input of stage 136, and capacitor 122, while a gate of P-type CMOS 230 is connected to a gate and a drain of P-type CMOS 234 and current source 238.

The base of PNP HBT 232 is connected to the collector of PNP HBT 232, to the base of PNP HBT 228, and to current source 236. The gate of P-type CMOS 234 is connected to the source of P-type CMOS 234, the gate of P-type CMOS 230, and current source 238. Thus, op-amp 100 includes a transimpedance stage with active loading using PNP HBTs and P-type CMOS.

Figure 10:
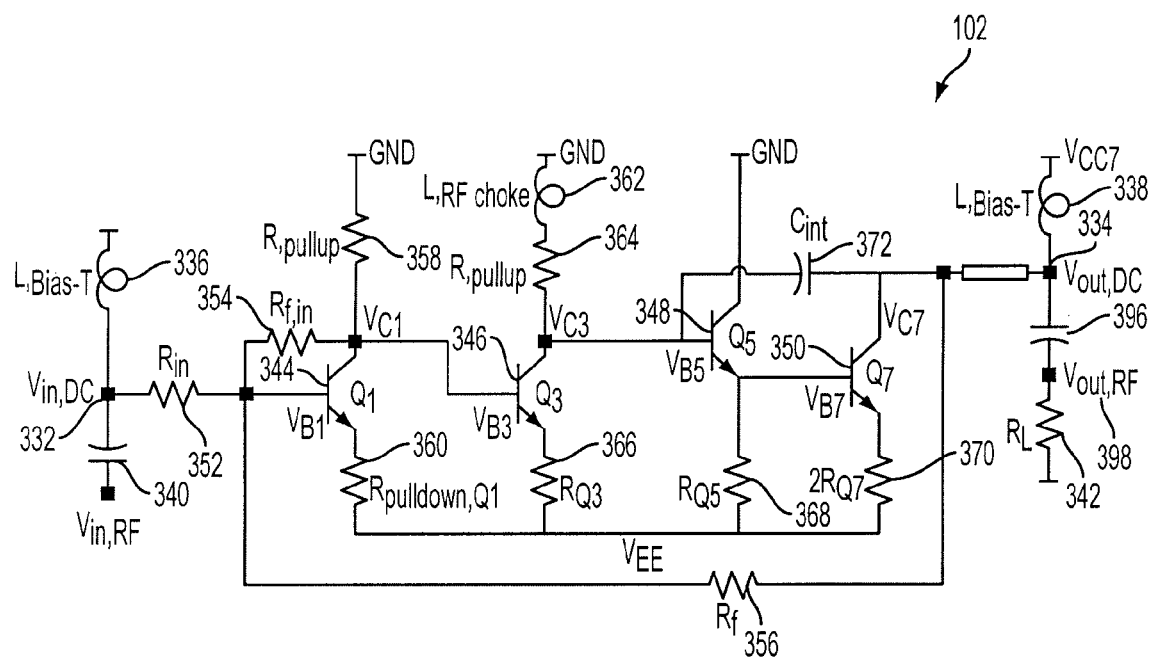
FIG. 10 is a schematic diagram of an alternate embodiment of an operational amplifier.

FIG. 10 is a schematic diagram of an alternate embodiment of an operational amplifier. In FIG. 10, op-amp 102 is a simple-Miller compensated single ended operational amplifier. Op-amp 102 includes NPN HBTs 344, 346, 348, and 350, resistors 342, 352, 354, 356, 358, 360, 364, 366, 368, and 370, inductors 336, and 338, and capacitors 340 and 396. Resistor 356 is a feedback resistor. The DC input voltage 332 is taken between inductor 336 and resistor 340, the DC output voltage 334 is taken between inductor 338 and capacitor 396, and the RF output voltage 338 is taken between capacitor 396 and resistor 342. Resistor 352 is connected to inductor 336, capacitor 340, resistor 354, resistor 356 and the base of NPN HBT 344.

The collector of NPN HBT 344 is connected to resistors 354, 358, and the base of NPN HBT 346. The emitter of NPN HBT 344 is connected to resistor 360. The collector of NPN HBT 346 is connected to resistor 364, the base of NPN HBT 348, and capacitor 372. Resistor 364 is also connected to inductor 362. The emitter of NPN HBT 348 is connected to resistor 368 and the base of NPN HBT 350. The collector of NPN HBT 350 is connected to capacitor 372 and resistor 356, inductor 338 and capacitor 396. Inductor 338, capacitor 396, and resistor 342 are connected to each other in series. Resistors 360, 366, 368, and 370 are connected to each other while resistor 358, inductor 362, and the collector of NPN HBT 348 are connected to the ground.

Figure 11:
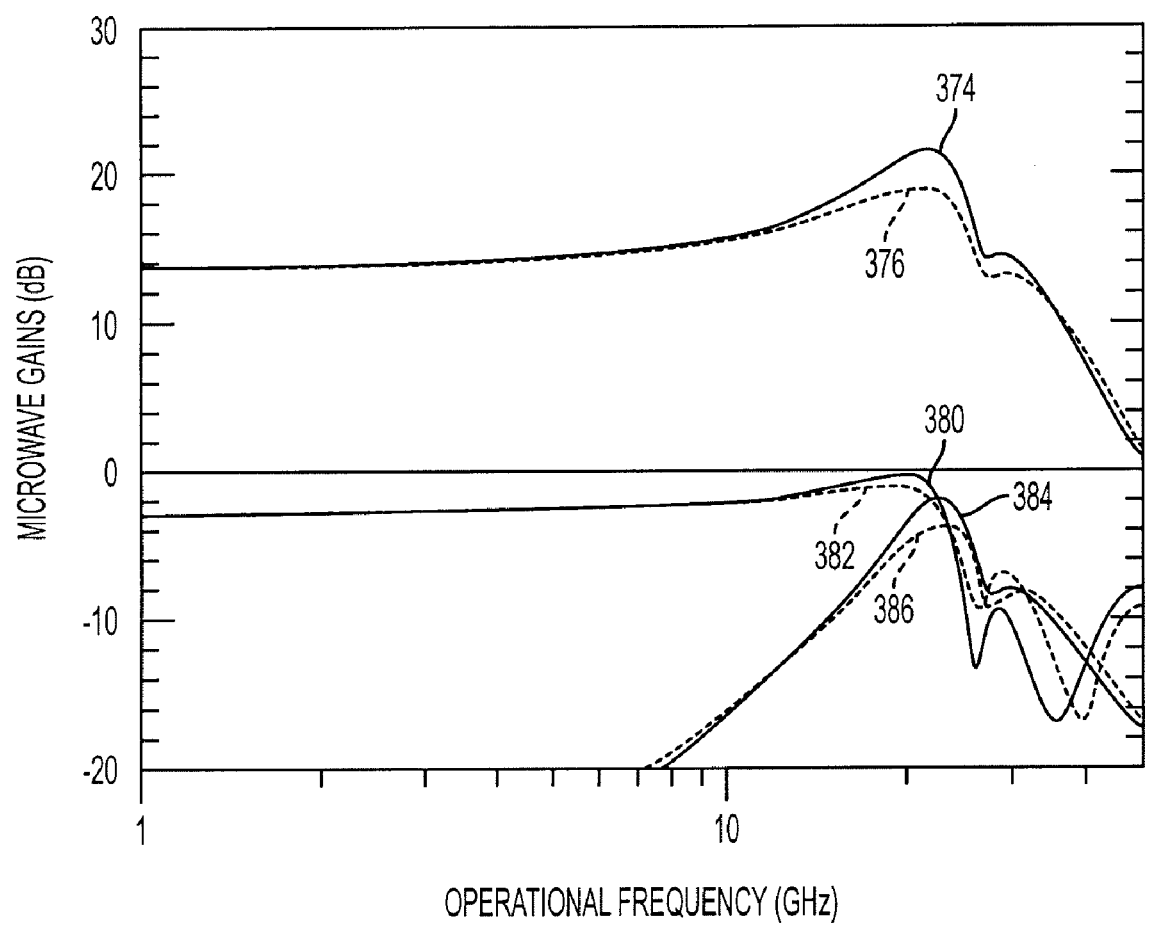
FIG. 11 is a graphical representation of the measured microwave gains of an operational amplifier.

FIG. 11 is a graphical representation of the measured microwave gains of an operational amplifier. In FIG. 11, op-amp 100 is an op-amp with a 35 GHz loop bandwidth which can be, for example, 3.5 times higher than a loop bandwidth of a conventional op-amp. Curve 374 represents $S_{21}$ with an integrative capacitor value of 200 fF, curve 376 represents $S_{21}$ with an integrative capacitor value of 250 fF, curve 380 represents $S_{22}$ with an integrative capacitor value of 200 fF, curve 382 represents $S_{22}$ with an integrative capacitor value of 250 fF, curve 384 represents $S_{11}$ with an integrative capacitor value of 200 fF, and curve 386 represents an integrative capacitor value of 250 fF. In curves 374, 376, 380, 382, and 384, the $R_{ex2}$ resistor, such as resistor 262 in FIG. 4, has a value of 25 ohms. $S_{21}$ can represent, for example, a forward gain of op-amp 100, while $S_{22}$ can represent, for example, an output return loss of op-amp 100, and $S_{11}$ can represent, for example, an input return loss of op-amp 100. As seen in FIG. 11, op-amp 100 of the present invention is stable across the 50 GHz operational frequency measurement span.

Figure 12:
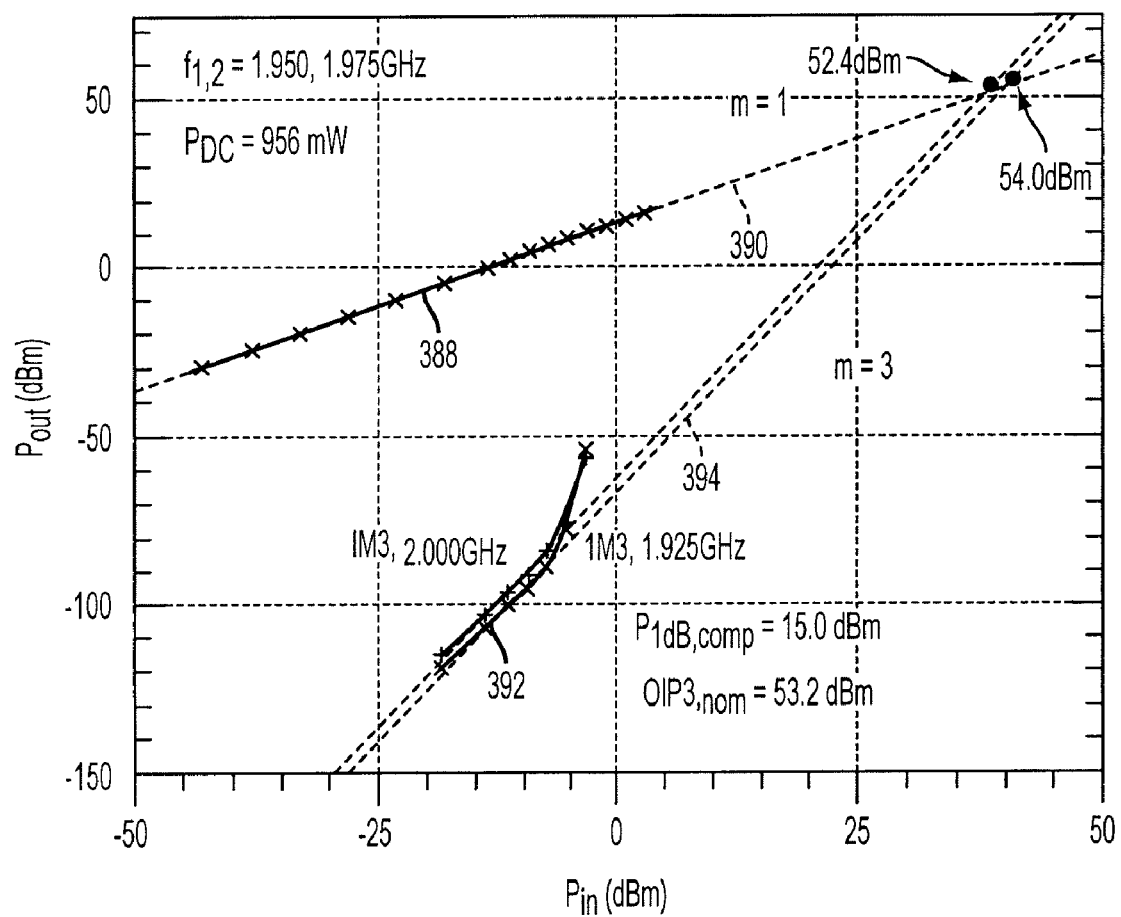
FIG. 12 is a graphical representation of two-tone power and third-order intermodulation distortion measurements of an operational amplifier.

FIG. 12 is a graphical representation of two-tone power and third-order intermodulation distortion measurements of an operational amplifier. In FIG. 12, op-amp 100 is again, the 35 GHz op-amp 100 disclosed in FIG. 11. Curve 388 represents an output power of the fundamental signals at 1.95, 1.975 GHz, curve 390 represents an output power of the fundamentals extrapolated with constant slope=1, curve 392 represents an output power of the third-order intermodulation products, and curve 394 represents an extrapolated output power of the intermodulation products w/slope=3. As seen in FIG. 12, two-tone power and third-order inter-modulation distortion measurements are made at approximately 2 GHz with 53.2 dBm output referred third-order intermodulation intercept point ("OIP3"), 956 mW, and record high OIP3/PDC=211. The 211 value can be approximately seven times higher than conventional op-amps at a 2 GHz operating frequency.

Thus, the present invention allows the op-amp to have very low power intermodulation distortion products (high linearity), where the output-referred third-order intermodulation intercept (OIP3) power is very high, without the use of very high bias currents. Furthermore, there can be high linearity while using lower amounts of DC Power. The present invention may also allow mm-Wave op-amp with high loop transmission approximately equal to the ratio of the loop-bandwidth to the operating frequency, to permit strong distortion suppression through feedback at frequencies at approximately 10% of the loop bandwidth while reducing current or power dissipation.

The present invention may also allow the op-amp to tolerate a range of source/input and load/output impedances presented to it. Furthermore, non-linearities associated with the feedback network are prevented through the use of the compact, folded floorplan of the present invention. If present, such non-linearities from the feedback network would introduce distortion that the feedback itself would not be able to suppress in conventional op-amp. In addition, the present invention can function without complementary devices and can function with just series resistor-inductor loading which can allow high open-loop gain $A_{ol}$.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An operational amplifier comprising:
   a first stage having first and second inputs and first and second outputs;
   a first resistor connected to the first input and the second output of the first stage;
   a second resistor connected to the second input and the first output of the first stage;
   a second stage for receiving the first and second outputs of the first stage; and
   an output stage coupled to an output of the second stage.

2. The operational amplifier of claim 1 further comprising:
   a first integrating capacitor connected to a first input of the output stage and a second output of the output stage; and
   a second integrating capacitor connected to a second input of the output stage and a first output of the output stage.

3. The operational amplifier of claim 1 further comprising a low-pass filter connected to the first stage.

4. The operation amplifier of claim 3 wherein the low-pass filter includes:
   a first filter resistor;
   a second filter resistor connected to the first filter resistor and the first input of the first stage;
   a first filter capacitor connected to the first filter resistor and the second filter resistor;
   a third filter resistor;
   a fourth filter resistor connected to the third filter resister and the second input of the first stage; and
   a second filter capacitor connected to the third filter resistor and the fourth filter resistor.

5. The operation amplifier of claim 1, wherein the first, second and output stages have active and biasing components, and wherein the active components are located in a central position and the biasing components are located in a periphery position.

6. The operational amplifier of claim 1 further comprising a third stage connected between the second stage and the output stage, the third stage including a first input and a second input.

7. The operational amplifier of claim 6 wherein there is a signal crossover between a stage immediately prior to the output stage and the output stage when a sum of a number of stages including the first stage and the output stage is an even number.

8. The operational amplifier of claim 6 further comprising:
a third integrating capacitor connected to the first input of the third stage and the second output of the output stage; and
a fourth integrating capacitor connected to the second input of the third stage and the first output of the output stage.

9. The operational amplifier of claim 1 wherein the first stage includes a simple differential pair.

10. The operational amplifier of claim 9 wherein the output stage includes a Darlington differential pair.

11. The operational amplifier of claim 10 wherein the first stage or the output stage includes a first transistor of a first type and a second transistor of a second type different from the first type.

12. An operational amplifier comprising:
a first stage;
an input source connected to the first stage;
an output stage connected to the first stage; and
a low-pass filter connected between the first stage and the input source, wherein there is a signal crossover between a stage immediately prior to the output stage and the output stage when a sum of a number of stages including the output stage is an even number.

13. The operational amplifier of claim 12 wherein
the first stage includes a first input, a second input, a first output, and a second output, and
the low-pass filter includes
a first filter resistor;
a second filter resistor connected to the first filter resistor and the first input of the first stage;
a first filter capacitor connected to the first filter resistor and the second filter resistor;
a third filter resistor;
a fourth filter resistor connected to the third filter resister and the second input of the first stage, and
a second filter capacitor connected to the third filter resistor and the fourth filter resistor.

14. A method for forming an operational amplifier comprising the steps of:
placing biasing components in a periphery position; and
placing active components in a central position relative to the biasing components, thereby reducing a length of a feedback loop.

15. The method of claim 14 further comprising the step of:
using a transimpedance input stage to increase loop bandwidth and gain bandwidth product.

16. The method of claim 15 further comprising the step of:
forming a signal crossover between a stage immediately prior to the output stage and the output stage when a sum of a number of stages including the transimpedance stage and the output stage is an even number.

17. The method of claim 16 further comprising the step of:
using a folded and a symmetrical floorplan for placement of components.

18. An operational amplifier comprising:
a first stage including a simple differential pair, the first stage connected to a first resistor and a second resistor; and
an output stage including a Darlington differential pair, the output stage coupled to the first stage.

19. The operational amplifier of claim 18 further comprising a second stage connected between the first stage and the output stage.

20. The operational amplifier of claim 19 further comprising:
a first integration capacitor connected to a first input of the output stage and a second output of the output stage; and
a second integrating capacitor connected to a second input of the output stage and a first output of the output stage.

21. The operational amplifier of claim 20 wherein the first stage includes first and second inputs and first and second outputs, and wherein the first resistor is connected to the first input of the first stage and the second output of the first stage, and the second resistor is connected to the second input of the first stage and the first output of the first stage.

22. The operational amplifier of claim 21 further comprising a low-pass filter connected to the first stage, the low-pass filter includes:
a first filter resistor;
a second filter resistor connected to the first filter resistor and the first input of the first stage;
a first filter capacitor connected to the first filter resistor and the second filter resistor;
a third filter resistor;
a fourth filter resistor connected to the third filter resister and the second input of the first stage; and
a second filter capacitor connected to the third filter resistor and the fourth filter resistor.

23. The operation amplifier of claim 18 wherein the first, second and output stages have active and biasing components, and wherein the active components are located in a central position and the biasing components are located in a periphery position.

24. The operational amplifier of claim 21 further comprising a third stage connected between the second stage and the output stage, the third stage including a first input and a second input.

25. The operational amplifier of claim 24 wherein there is a signal crossover between a stage immediately prior to the output stage and the output stage when a sum of a number of stages including the first stage and the output stage is an even number.

26. The operational amplifier of claim 24 further comprising:
a third integrating capacitor connected to the first input of the third stage and the second output of the output stage; and
a fourth integrating capacitor connected to the second input of the third stage and the first output of the output stage.

27. The operational amplifier of claim 18 wherein the first stage or the output stage includes a first transistor of a first type and a second transistor of a second type different from the first type.

28. An operational amplifier comprising:
a first stage connected to a first resistor and a second resistor;
an output stage; and
at least one second stage coupled between the first stage and the output stage, wherein there is a signal crossover between a stage immediately prior to the output stage and the output stage when a sum of a number of stages include the first and output stages is an even number.

29. The operational amplifier of claim 28 further comprising:
a first integration capacitor connected to a first input of the output stage and a second output of the output stage; and
a second integrating capacitor connected to a second input of the output stage and a first output of the output stage.

30. The operational amplifier of claim 29 wherein the first stage includes first and second inputs and first and second outputs, and wherein the first resistor is connected to the first input of the first stage and the second output of the first stage, and the second resistor is connected to the second input of the first stage and the first output of the first stage.

31. The operational amplifier of claim 30 further comprising a low-pass filter connected to the first stage, the low-pass filter includes:
- a first filter resistor;
- a second filter resistor connected to the first filter resistor and the first input of the first stage;
- a first filter capacitor connected to the first filter resistor and the second filter resistor;
- a third filter resistor;
- a fourth filter resistor connected to the third filter resister and the second input of the first stage; and
- a second filter capacitor connected to the third filter resistor and the fourth filter resistor.

32. The operation amplifier of claim 28 wherein the first, second and output stages have active and biasing components, and wherein the active components are located in a central position and the biasing components are located in a periphery position.

33. The operational amplifier of claim 28 further comprising a third stage connected between the second stage and the output stage, the third stage including a first input and a second input.

34. The operational amplifier of claim 28 further comprising:
- a third integrating capacitor connected to the first input of the third stage and the second output of the output stage; and
- a fourth integrating capacitor connected to the second input of the third stage and the first output of the output stage.

35. The operational amplifier of claim 28 wherein the first stage includes a simple differential pair.

36. The operational amplifier of claim 28 wherein the output stage includes a Darlington differential pair.

* * * * *